(12) United States Patent
Kelley et al.

(10) Patent No.: US 10,903,409 B1
(45) Date of Patent: Jan. 26, 2021

(54) THERMOELECTRIC GENERATOR FOR SEMICONDUCTOR POWER MODULE

(71) Applicant: DENSO International America, Inc., Southfield, MI (US)

(72) Inventors: Andrew Kelley, Milford, MI (US); Todd Witkowski, South Lyon, MI (US); Emily Arnold, Oak Park, MI (US); Rachel Cleveland, Farmington Hills, MI (US)

(73) Assignee: DENSO International America, Inc., Southfield, MI (US)

( * ) Notice: Subject to any disclaimer, the term of this patent is extended or adjusted under 35 U.S.C. 154(b) by 0 days.

(21) Appl. No.: 16/522,340

(22) Filed: Jul. 25, 2019

(51) Int. Cl.
| | |
|---|---|
| *H01L 35/32* | (2006.01) |
| *H01L 23/46* | (2006.01) |
| *H01L 29/739* | (2006.01) |
| *H01L 23/367* | (2006.01) |
| *H02M 7/537* | (2006.01) |
| *H02P 27/06* | (2006.01) |
| *B60L 50/51* | (2019.01) |
| *B60L 50/60* | (2019.01) |
| *H02M 7/00* | (2006.01) |

(52) U.S. Cl.
CPC ............ *H01L 35/32* (2013.01); *B60L 50/51* (2019.02); *B60L 50/60* (2019.02); *H01L 23/367* (2013.01); *H01L 23/46* (2013.01); *H01L 29/7393* (2013.01); *H02M 7/003* (2013.01); *H02M 7/537* (2013.01); *H02P 27/06* (2013.01); *B60L 2210/40* (2013.01)

(58) Field of Classification Search
CPC .......... H01L 27/16; H01L 35/30; H01L 35/32
See application file for complete search history.

(56) References Cited

U.S. PATENT DOCUMENTS

| | | | |
|---|---|---|---|
| 7,019,395 B2 | 3/2006 | Hirano et al. | |
| 2013/0298956 A1* | 11/2013 | Hiller | H01L 35/30 136/212 |
| 2018/0041136 A1* | 2/2018 | Tokuyama | H01L 23/3675 |
| 2018/0116076 A1* | 4/2018 | Dede | H01L 35/30 |

FOREIGN PATENT DOCUMENTS

| | | |
|---|---|---|
| DE | 19946806 A1 | 4/2001 |
| WO | 16097642 A1 | 6/2016 |

* cited by examiner

*Primary Examiner* — Moazzam Hossain
*Assistant Examiner* — Mohammad A Rahman
(74) *Attorney, Agent, or Firm* — Harness, Dickey & Pierce, P.L.C.

(57) ABSTRACT

A semiconductor power module configured to convert direct current to alternating current. The semiconductor power module includes a power semiconductor device and a thermoelectric generator configured to convert heat generated by the power semiconductor device into electric energy.

17 Claims, 3 Drawing Sheets

US 10,903,409 B1

THERMOELECTRIC GENERATOR FOR SEMICONDUCTOR POWER MODULE

FIELD

The present disclosure relates to a thermoelectric generator for a semiconductor power module.

BACKGROUND

This section provides background information related to the present disclosure, which is not necessarily prior art.

Semiconductor power modules are used in inverter circuits to drive a vehicle motor, such as in a fully electric vehicle or a hybrid electric vehicle. While such semiconductor power modules are suitable for their intended use, they are subject to improvement. For example, semiconductor power modules in inverters are the main source of efficiency losses during operation. The losses are in the form of heat produced when the power modules are operating (switching). Improved power modules with increased efficiency would thus be desirable.

SUMMARY

This section provides a general summary of the disclosure, and is not a comprehensive disclosure of its full scope or all of its features.

The present disclosure includes a semiconductor power module configured to convert direct current to alternating current. The semiconductor power module includes a power semiconductor device and a thermoelectric generator configured to convert heat generated by the power semiconductor device into electric energy.

The present disclosure further includes a semiconductor power module configured to convert direct current to alternating current. The semiconductor power module includes a semiconductor package, a power semiconductor device, and a thermoelectric generator. The power semiconductor device is included within the semiconductor package. The thermoelectric generator is configured to convert heat generated by the power semiconductor device into electric energy. The thermoelectric generator includes an n-doped semiconductor and a p-doped semiconductor extending between a first surface heated by the power semiconductor device and terminals for connection to a load to provide the electric energy to the load.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of select embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
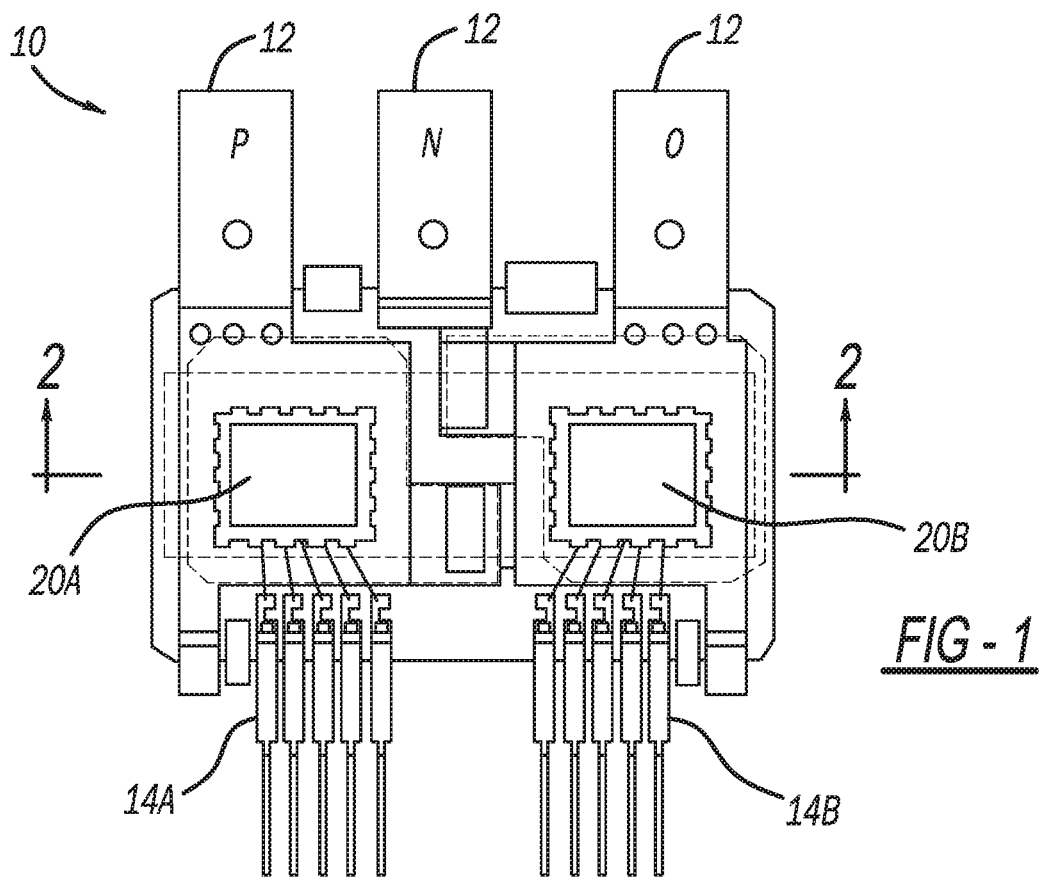
FIG. 1 is a plan view of an exemplary semiconductor power module in accordance with the present disclosure.
Figure 5:
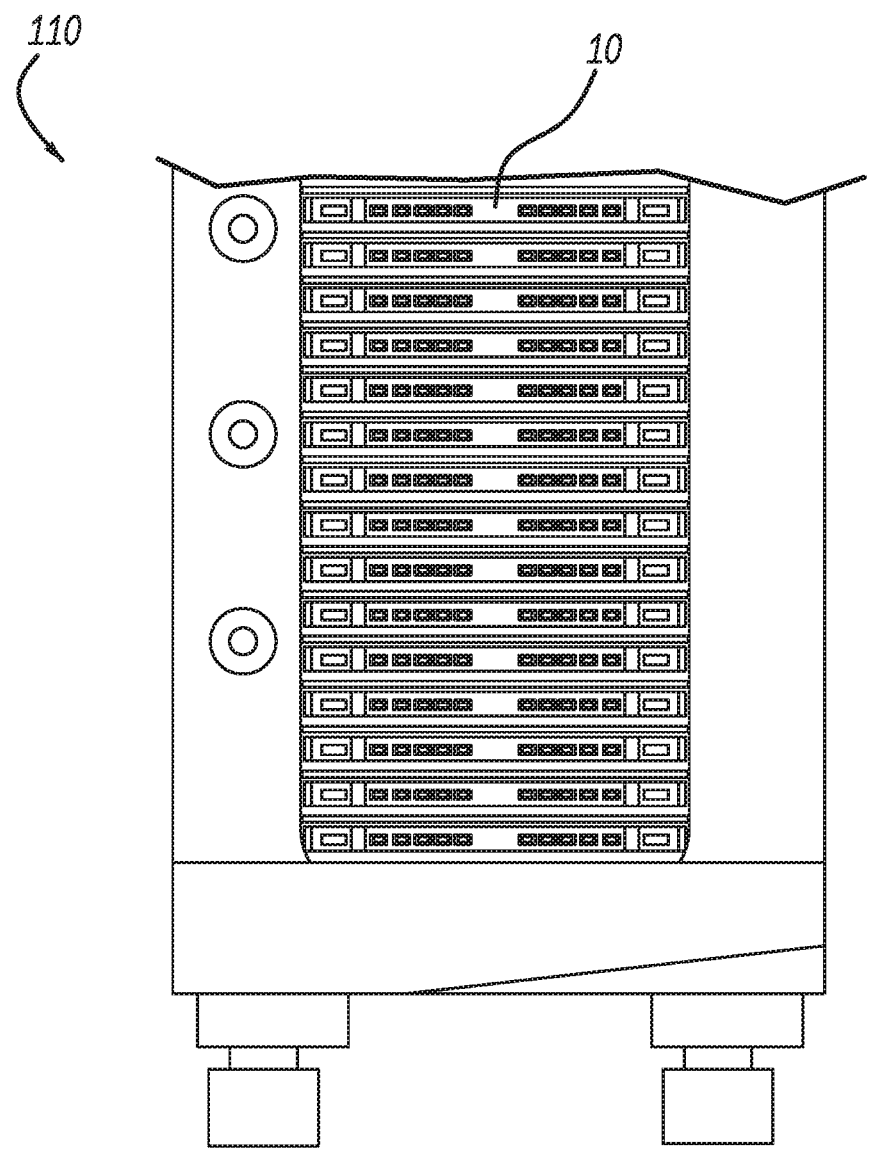
FIG. 5 illustrates an exemplary traction inverter including a plurality of the semiconductor power modules of the present disclosure.

FIG. 1 illustrates an exemplary semiconductor power module 10 in accordance with the present disclosure. The semiconductor power module 10 converts DC current to AC current. The semiconductor power module 10 may be used in any suitable application, such as with a traction inverter 110 (FIG. 5) of a vehicle for converting DC current from the vehicle's electric battery to AC current for use in an electric motor to drive the vehicle's propulsion system. The inverter 110 may include a plurality of the semiconductor power modules 10 in accordance with the present disclosure, as illustrated in FIG. 5.

The vehicle propulsion system may be any suitable hybrid propulsion system or a fully electric propulsion system. The module 10 may also be operated in reverse whereby AC current is converted to DC current, such as for capturing energy during regenerative breaking and directing the energy back to the vehicle's battery to charge the battery. The semiconductor power module 10 generally includes terminals 12 through which DC current is input to (or output from) the semiconductor power module 10, and sets of terminals 14A and 14B through which AC current exits (or enters) the module 10.

With additional reference to FIG. 2, additional features of the semiconductor power module 10 will now be described. The semiconductor power module 10 includes a semiconductor package (or case) 16. Seated within the semiconductor package 16 is one or more power semiconductor devices. In the example illustrated, the semiconductor package 16 includes a first power semiconductor device 20A and a second power semiconductor device 20B. The power semiconductor devices 20A, 20B may be any suitable power semiconductor devices, such as insulated-gate bipolar transistors (IGBT).

With respect to the first power semiconductor device 20A, it is arranged between two solder layers 22A and 24A. The solder layer 22A is arranged on any suitable heat spreader 26A, such as a copper heat spreader. The terminals 14A are arranged between the solder layer 24A and another solder layer 28A. Arranged on the solder layer 28A is another heat spreader 30A, such as a copper heat spreader. The power semiconductor device 20B is arranged amongst the same layers as the power semiconductor device 20A, which are illustrated in FIG. 2 with the same reference numerals, but with a suffix "B" instead of "A." The description of the layers on either side of the power semiconductor device 20A also applies to the layers on either side of the power semiconductor device 20B. The heat spreader 30A is connected to the heat spreader 26B by way of connection 32.

The semiconductor power module 10 is configured as a dual sided cooling power module in the examples illustrated. However, the semiconductor power module 10 may be configured alternatively as a single sided cooling power module. As a dual sided cooling power module, the module 10 includes a lower (or first) cooler 40A and an upper (or second) cooler 40B. The lower cooler 40A includes a coolant line 42A extending therethrough for circulating any suitable coolant through the lower cooler 40A. Likewise, the upper cooler 40B includes a coolant line 42B.

Figure 2:
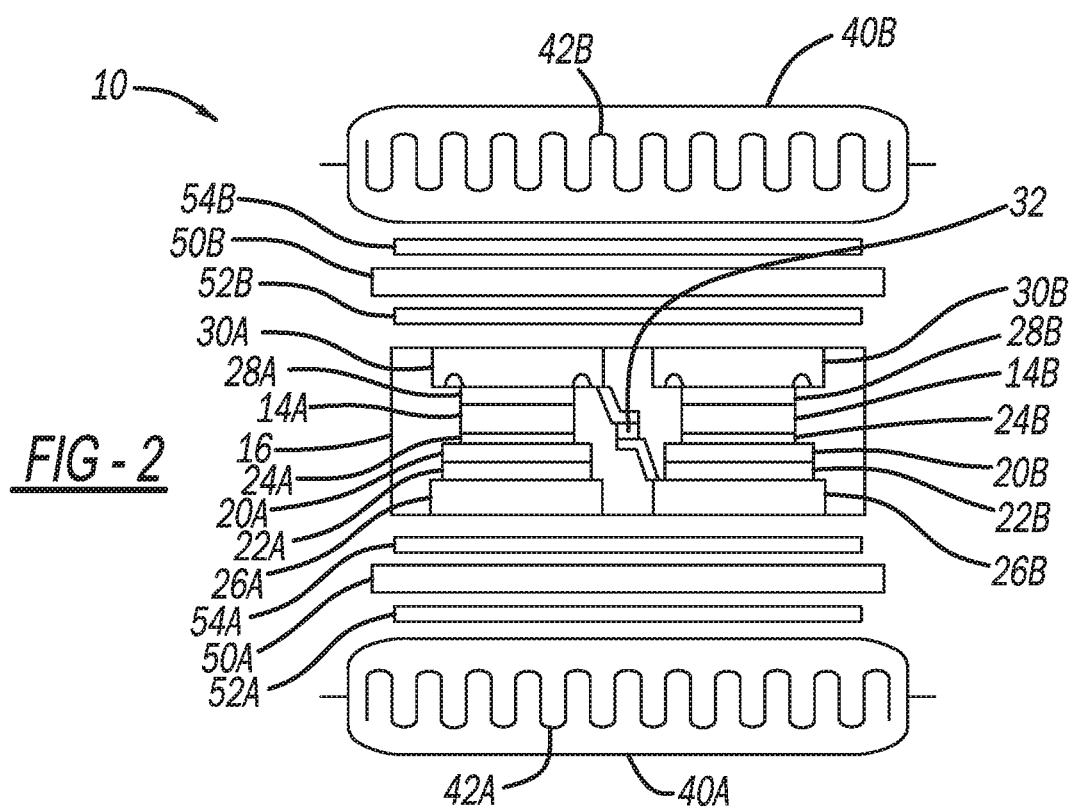
FIG. 2 is a cross-sectional view taken along line 2-2 of FIG. 1.

Between the lower cooler 40A and the semiconductor package 16 is a first thermoelectric generator 50A, which in the example of FIG. 2 replaces an insulator plate found in some current semiconductor power modules. Thermal paste layers 52A and 54A are on opposite sides of the first thermoelectric generator 50A. Between the upper cooler 40B and the semiconductor package 16 is a second thermoelectric generator 50B. Thermal paste layers 52B and 54B are on opposite sides of the second thermoelectric generator 50B. The first and second thermoelectric generators 50A, 50B are configured to convert heat generated by the power semiconductor devices 20A and 20B into electric energy as described further herein in conjunction with the description of FIG. 4.

Figure 3:
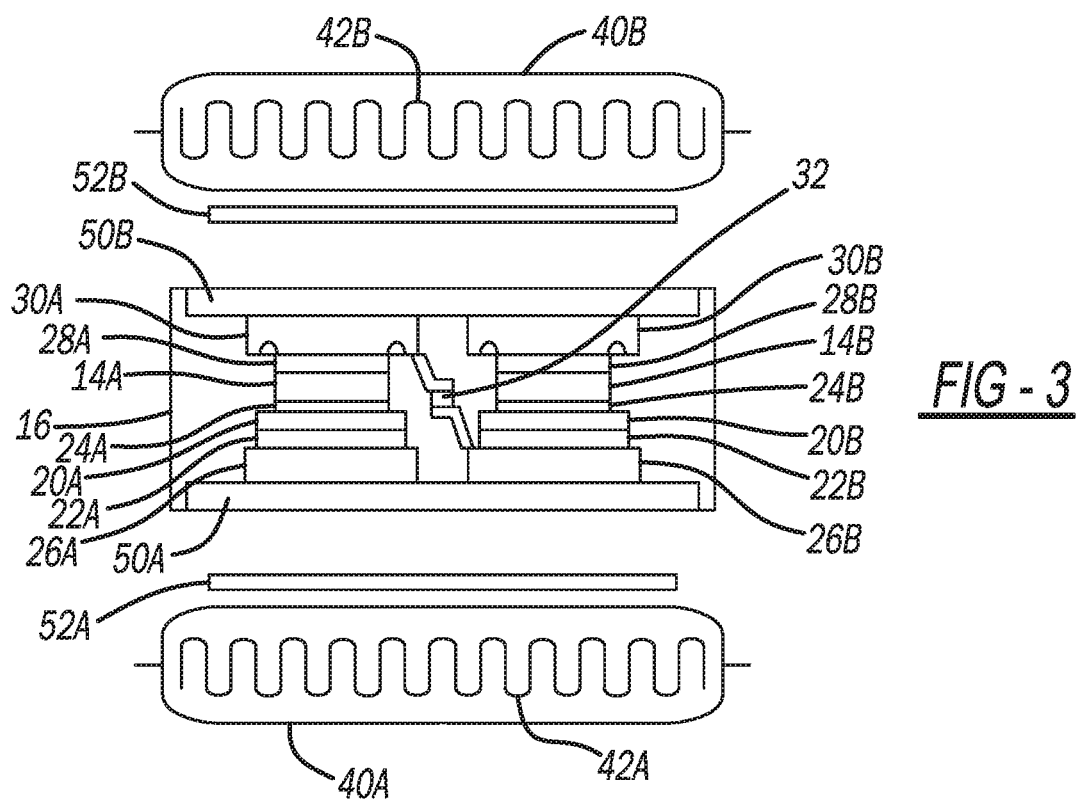
FIG. 3 is a cross-sectional view of another exemplary semiconductor power module in accordance with the present disclosure.

Although FIG. 2 illustrates the first and second thermoelectric generators 50A, 50B as being outside of the semiconductor package 16 (and taking the place of insulator plates of existing semiconductor power modules) the first and second thermoelectric generators 50A, 50B may be arranged at any other suitable position as well. For example and as illustrated in FIG. 3, the first and second thermoelectric generators 50A and 50B may be arranged within the semiconductor package (or case) 16. In the arrangement of FIG. 3, only a single thermal paste layer 52A is between the lower cooler 40A and the semiconductor package 16, and only a single thermal paste layer 52B is between the upper cooler 40B and the semiconductor package 16.

Figure 4:
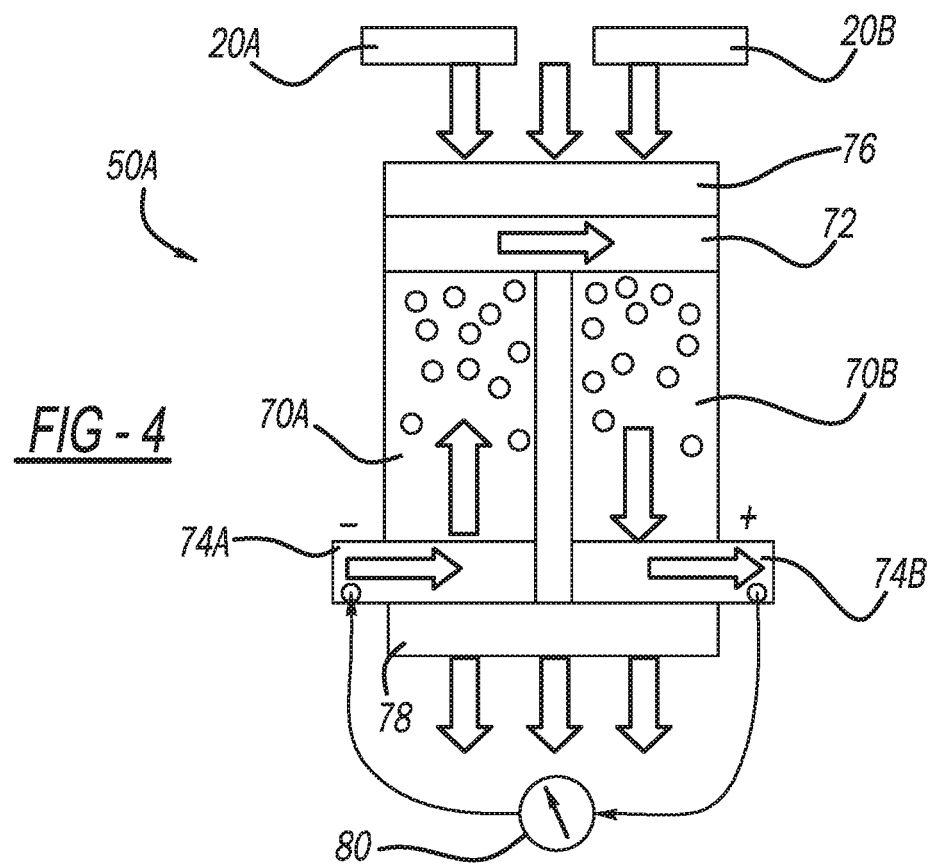
FIG. 4 illustrates an exemplary thermoelectric generator in accordance with the present disclosure.

With reference to FIG. 4, the first thermoelectric generator 50A will now be described further. The first thermoelectric generator 50A is similar to, or identical to, the second thermoelectric generator 50B, and thus the following description of the first thermoelectric generator 50A also applies to the second thermoelectric generator 50B. The first thermoelectric generator 50A includes a negative-doped (n-doped) semiconductor 70A and a positive-doped (p-doped) semiconductor 70B. On a side closest to the power semiconductor devices 20A, 20B, the n-doped semiconductor 70A is connected to the p-doped semiconductor 70B by a connector terminal (or conductor) 72. On a side of the n-doped semiconductor 70A opposite to the connector terminal 72 is a negative terminal 74A. On a side of the p-doped semiconductor 70B opposite to the connector terminal 72 is a positive terminal 74B. Between the power semiconductor devices 20A, 20B and the connector terminal 72 is a heated surface (or first surface) 76. On a side of the terminals 74A and 74B opposite to the semiconductors 70A and 70B is a heat sink or cold surface (also referred to as a second surface) 78.

Heat generated by the power semiconductor devices 20A, 20B heats the heated surface 76 to create a temperature differential on opposite sides of the semiconductors 70A, 70B. This temperature differential generates energy, such as a voltage 80, due to the Seebeck effect. The Seebeck effect occurs as a result of movement of charge carriers within the semiconductors 70A, 70B. In the n-doped semiconductor 70A, the charge carriers are electrons. In the p-doped semiconductor 70B, the charge carriers are holes. Charge carriers diffuse away from the side of the semiconductors 70A, 70B heated by the power semiconductor devices 20A, 20B. This diffusion leads to a buildup of charge carriers at the relatively cooler end proximate to the terminals 74A and 74B. This buildup of charge creates a voltage potential that is directly proportional to the temperature difference across the semiconductors 70A and 70B.

The voltage 80 generated by the thermoelectric generators 50A, 50B may be provided to any suitable load, such as to power any suitable device of the vehicle or charge any suitable battery of the vehicle. The voltage 80 may also be fed back into the traction inverter 110 to power an electric motor driving the propulsion system of the vehicle. The semiconductor power module 10 thus advantageously harnesses the heat released from the power semiconductor devices 20A, 20B to enhance the efficiency of the semiconductor power module 10. One skilled in the art will appreciate that the present disclosure provides numerous additional advantages as well.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A semiconductor power module configured to convert direct current to alternating current, the semiconductor power module comprising:
   first terminals for conducting direct current to the semiconductor power module from a battery of a vehicle;
   a semiconductor package including a power semiconductor device connected to second terminals for conducting alternating current from the semiconductor power module; and
   a thermoelectric generator configured to convert heat generated by the power semiconductor device into electric energy;
   wherein the semiconductor power module is one of a plurality of likewise configured semiconductor power modules arranged in a traction inverter that generates alternating current for powering an electric motor of the vehicle to drive a vehicle propulsion system.

2. The semiconductor power module of claim 1, wherein the power semiconductor device is an insulated-gate bipolar transistor (IGBT).

3. The semiconductor power module of claim 1, wherein:
   a first cooler of the semiconductor power module is on a first side of the semiconductor package; and
   a second cooler of the semiconductor power module is on a second side of the semiconductor package.

4. The semiconductor power module of claim 3, wherein the power semiconductor device is a first power semiconductor device, the semiconductor power module further comprising a second power semiconductor device within the semiconductor package.

5. The semiconductor power module of claim 1, wherein the thermoelectric generator is arranged outside the semiconductor package.

6. The semiconductor power module of claim 1, wherein the thermoelectric generator is arranged inside the semiconductor package.

7. The semiconductor power module of claim 1, wherein the semiconductor package includes heat spreaders on opposite sides of the power semiconductor device.

8. The semiconductor power module of claim 1, wherein the thermoelectric generator is a Seebeck generator.

9. The semiconductor power module of claim 1, wherein the thermoelectric generator includes:
   an n-doped semiconductor extending between a connector terminal and a negative terminal; and
   a p-doped semiconductor extending between the connector terminal and a positive terminal.

10. The semiconductor power module of claim 9, wherein the thermoelectric generator further includes:
    a first surface heated by the power semiconductor device when the power semiconductor device is active, the connector terminal is between the first surface and each of the n-doped semiconductor and the p-doped semiconductor; and
    a second surface configured as heat sink, the second surface is on a side of each of the negative terminal and the positive terminal that is opposite to each of the n-doped semiconductor and the p-doped semiconductor.

11. The semiconductor power module of claim 1, wherein:
    the thermoelectric generator is a first thermoelectric generator on a first side of the power semiconductor device; and
    a second thermoelectric generator is on a second side of the power semiconductor device.

12. A semiconductor power module configured to convert direct current to alternating current, the semiconductor power module comprising:
    first terminals for conducting direct current to the semiconductor power module from a battery of a vehicle;
    a semiconductor package including a power semiconductor device connected to second terminals for conducting alternating current from the semiconductor power module; and
    a thermoelectric generator configured to convert heat generated by the power semiconductor device into electric energy, the thermoelectric generator including:
    an n-doped semiconductor and a p-doped semiconductor both extending between a first surface heated by the power semiconductor device and terminals for connection to a load to provide the electric energy to the load;
    wherein:
    the power semiconductor device is a first power semiconductor device in the semiconductor package, and a second power semiconductor device is in the package connected to additional second terminals for conducting alternating current out of the semiconductor power module;
    a first pair of heat spreaders are in the semiconductor package on opposite sides of the first power semiconductor device, a second pair of heat spreaders are in the semiconductor package on opposite sides of the second power semiconductor device, and one of the first pair of heat spreaders is connected to one of the second pair of heat spreaders;
    the thermoelectric generator is a first thermoelectric generator on a first side of the semiconductor package, and a second thermoelectric generator is on a second side of the semiconductor package; and
    the semiconductor power module is one of a plurality of likewise configured semiconductor power modules arranged in a traction inverter that generates alternating current for use in an electric motor of the vehicle to drive a vehicle propulsion system.

13. The semiconductor power module of claim 12, wherein the power semiconductor device is an insulated-gate bipolar transistor (IGBT).

14. The semiconductor power module of claim 12, wherein the thermoelectric generator is outside of the semiconductor package.

15. The semiconductor power module of claim 12, wherein the thermoelectric generator is inside of the semiconductor package.

16. The semiconductor power module of claim 12, further comprising a first cooler on a first side of the semiconductor package and a second cooler on a second side of the semiconductor package.

17. The semiconductor power module of claim 12, wherein the thermoelectric generator is a Seebeck generator.

* * * * *

UNITED STATES PATENT AND TRADEMARK OFFICE
CERTIFICATE OF CORRECTION

| | | |
|---|---|---|
| PATENT NO. | : 10,903,409 B1 | Page 1 of 1 |
| APPLICATION NO. | : 16/522340 | |
| DATED | : January 26, 2021 | |
| INVENTOR(S) | : Andrew Kelley et al. | |

It is certified that error appears in the above-identified patent and that said Letters Patent is hereby corrected as shown below:

On the Title Page

Column 1, item (22), Line 1: After "2019", insert --¶(65) Prior Publication Data
US 2021/0028341 A1 Jan. 28, 2021--

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*